May 25, 1965 M. COLL-PALAGOS 3,185,471

EXPOSURE APPARATUS

Filed May 31, 1962

INVENTOR.

MIGUEL COLL-PALAGOS

BY

Arthur H. Seidel

ATTORNEY

United States Patent Office 3,185,471

Patented May 25, 1965

3,185,471
EXPOSURE APPARATUS

Miguel Coll-Palagos, Bronxville, N.Y., assignor to Aluminum Development Corporation, New York, N.Y., a corporation of New York Filed May 31, 1962, Ser. No. 199,133
8 Claims. (Cl. 269—221)

This invention relates to an exposure apparatus, and more particularly, to an apparatus which is simple, inexpensive and capable of exposing a controlled portion of a workpiece so that such controlled portion may be surface finished.

The apparatus of the present invention is particularly designed so as to provide a fine separation line between the portion which is to be surface finished and the remainder of the workpiece. The surface finish operation may assume a wide variety of forms such as abraiding, painting, acid etching, engraving, printing, etc. Heretofore, the devices or methods designed to expose a controlled portion of a workpiece were unsatisfactory since they did not cooperate with the workpiece in a manner so that the exposed area may be controlled within extremely accurate tolerances and enable a clean sharp demarcation line to be provided between the finished portion and the unfinished portion of the workpiece.

The exposure apparatus of the present invention is particularly designed to enable a portion of a workpiece to be surface finished in a manner so that the finished portion is controlled to an accuracy of ±.001 inch and have a clean sharp demarcation line between the finished and unfinished portion. Further, the exposure apparatus of the present invention is capable of being utilized on workpieces which are irregularly shaped in contour as well as in transverse and longitudinal cross section. Hence, the workpiece need not be a flat surface but may be an irregularly shaped article having a plurality of compound curves.

The exposure apparatus of the present invention overcomes the necessities of the requirement to have special atmospheres, complex bulky equipment, etc. The exposure apparatus of the present invention includes a base on which the workpiece will be accurately positioned and supported with respect to three registration points. A template structure is removably secured to the base with three point registration. The template structure includes a flexible portion having an aperture which is adapted to overlie a portion of the workpiece. The flexible portion of the template structure is adapted to conform to the shape of the workpiece in response to the pressure exerted by the means for removably securing the template structure to the base.

It is an object of the present invention to provide a novel exposure apparatus.

It is another object of the present envention to provide a novel exposure apparatus which is simple, inexpensive and easy to utilize.

It is another object of the present invention to provide a novel exposure apparatus capable of enabling an accurately defined portion of a workpiece to be surface finished with a sharp demarcation line between the finished and unfinished portion.

It is another object of the present invention to provide a novel exposure apparatus capable of enabling a portion of a workpiece to be coated even though the exposed surface of the workpiece is non-planar.

It is still another object of the present invention to provide a novel exposure apparatus wherein a flexible portion of a template structure is mounted with three point registration with respect to a workpiece adapted to have a portion of its exterior surface finished.

Other objects will appear hereinafter.

For the purpose of illustrating the invention there is shown in the drawings a form which is presently preferred; it being understood, however, that this invention is not limited to the precise arrangements and instrumentalities shown.

Figures 1, 2, 3, 4, 5:
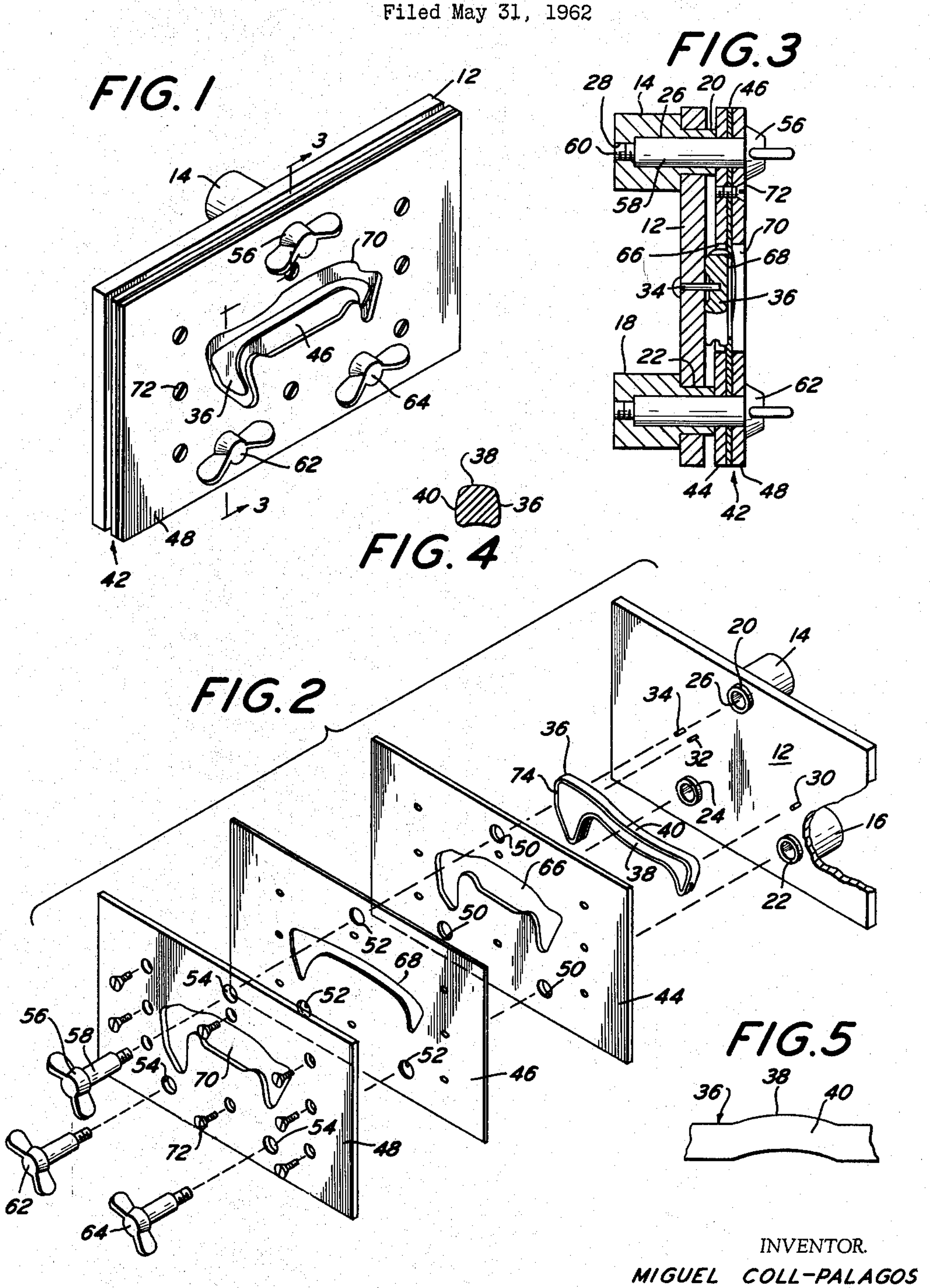
FIGURE 1 is a perspective view of the exposure apparatus of the present invention.
FIGURE 2 is an exploded view of the exposure apparatus in FIGURE 1.

FIGRE 3 is a sectional view taken along the lines 3—3 in FIGURE 1.

FIGURE 4 is a transverse sectional view through a central portion of the workpiece illustrated in FIGURE 2.

FIGURE 5 is a side elevational view of the central portion of the workpiece illustrated in FIGURE 2.

Referring to the drawing in detail, wherein like numerals indicate like elements, there is shown in FIGURE 1 an exposure apparatus designated generally as 10.

The exposure apparatus 10 includes a flat planar base plate 12. The base plate 12 may be of a substantial size so as to accommodate a plurality of workpieces. For purposes of the present illustration, the base plate 12 is of sufficient size to only accommodate one workpiece. The base plate 12 is provided with a plurality of bushings 14, 16 and 18 on a rear surface thereof.

The bushing 14 is provided with a reduced diameter portion 20 which is force-fitted in a hole extending through the base plate 12. The axial length of the reduced diameter portion 20 is slightly greater than the thickness of the base 12 so as to result in the provision of a raised boss. The bushings 16 and 18 are similarily provided with a reduced diameter portion 22 and 24 respectively.

Each of the bushings 14, 16 and 18 are identical. Each of the bushings are provided with a smooth bore 26 extending for substantially the full length thereof. A smaller diameter threaded bore 28 is provided coaxially with the bore 26 at the end of the bushing remote from the reduced diameter portion on each bushing.

On the face of the base plate 12 remote from the bushings, there are provided a plurality of workpiece mounting pins 30, 32 and 34. It will be noted that the pins 32 and 34 are closer to each other and are adapted to cooperate with one end of the workpiece. The pin 30 is adapted to cooperate with the opposite end of the workpiece. The workpiece to be supported on the pins 30—34 is designated generally as 36.

The workpiece 36 may assume any one of a wide variety of regular or irregular shapes. For purposes of illustration, the workpiece 36 is provided with an irregular shape and is composed of planar surfaces as well as compound curves. As shown more clearly in FIGURE 4, an upper surface of the central portion of the workpieces 36 may have a convex upper surface 38 and a convex side surface 40. As shown more clearly in FIGURE 5, the upper surface 38 and side surface 40 may be arcuate in side elevation and thereby lying in a higher plane from the juxtaposed surface of the base plate 12 as compared with the remainder of the workpiece 36.

The workpiece 36 is provided with three blind holes on its rear surface for receiving the pins 30–34. The workpiece 36 is retained on the pins 30–34 and a portion of the top surface of the workpiece will be exposed for surface finishing by a sandwich means 42. The sandwich means 42 includes an inner plate 44, a middle plate 46 and an outer plate 48 which are secured together and movable as a unit. The sandwich means 42 is removably secured to the base plate 12 by means of three point registration.

In order to provide such three point registration, the plate 44 is provided with three holes 50 which form a triangle. Each of the holes 50 are in line with the bore 26 in one of the bushings 14, 16, and 18. The diameter of the bore 26 for each bushing corresponds with the diameter of the holes 50. The middle plate 46 is provided with three holes 52 corresponding identically with the holes 50. The outer plate 48 is provided with three holes 54 corresponding identically with the holes 52.

A wing nut 56 having a shank portion 58 and a reduced diameter threaded portion 60 extends through the uppermost hole 54, 52, 50 and through the bore 26 of the bushing 14. The reduced diameter threaded portion 60 is threadedly engaged with the threads in the bore 28 on the bushing 14.

A wing nut 62 similar to wing nut 56 extends through one of the holes in the plates 44–48 and through the bore 26 in the bushing 18. A similar wing nut 64 extends through the remaining hole in the plates 44–48 and through the bore 26 in the bushing 16.

The inner plate 44 is provided with an irregularly shaped aperture 66 corresponding generally to the shape of the workpiece 36 but having greater longitudinal and transverse dimensions. The middle plate 46 is provided with an aperture 68 which corresponds generally with the shape of the workpiece 36 but having longitudinal and transverse dimensions which are smaller than the upper surface of the workpiece 36. The outer plate 48 is provided with an opening 70 which corresponds generally to the shape of the workpiece 36 but having dimensions identical with that of the aperture 66. The inner and outer plates 44 and 48, respectively, may be made from a rigid metal or plastic. For purposes of illustration, the plates 44 and 48 may have a thickness of approximately .090 inch. The middle plate 46 is preferably made from a sheet of any flexible material having a thickness so as to conform easily with the shape or contour of the workpiece. Since the apertures 66 and 70 are substantially identical and have greater longitudinal and transverse dimensions than the aperture 68, it will be obvious that there is a portion of the plate 46 which is immediately adjacent to the aperture 68 and is not disposed between and in abutting engagement with a surface of the plates 44 and 48. Hence, the last mentioned portion is capable of flexing to accommodate to the juxtaposed surface of the workpiece 36.

In order that the sandwich means 42 may be utilized as a unit, a plurality of spaced aligned holes are provided in the plates 44, 46 and 48. A screw 72 is disposed in each of the last mentioned holes. The screws 72 may cooperate with internal threads in the last mentioned holes in the plate 44. The last mentioned holes extending through the plate 48 are preferably countersunk so as to accommodate the head of the screws 72. It will be noted that the countersinking of the holes in the plate 48 enables the screws 72 to have a length corresponding with the combined thicknesses of the plates of the sandwich means 42. In this manner, there are no projections beyond the faces of the sandwich means 42.

The exposure apparatus 10 of the present invention is utilized in the following manner:

The base plate 12 is secured in any desirable location. Thereafter, the workpiece 36 is mounted on the pins 30–32 which are received within blind holes on a rear surface of the workpiece 36. Thereafter, the sandwich means 42 is applied to the base plate 12 with three point registration being obtained by means of the wing nuts 56, 62 and 64. The wing nuts extend through the three sets of aligned holes and are tightened until the portion of the middle plate 46 surrounding the aperture 68 has conformed to the juxtaposed surface of the workpiece 36. In this regard, it will be noted that the sandwich means 42 is sufficiently rigid in the area through which the shank on the wing nuts extend so that this portion does not flex when the wing nuts are tightened. In FIGURE 3, the wing nuts have been tightened to their fullest extent so that the inner face of the inner plate 44 is in abutting contact with the end face of the reduced diameter portions 20, 22 and 24. As shown more clearly in FIGURE 3, the size of the wing nuts is sufficient so that tightening of the wing nuts applies pressure over a surface which is at least as great as the end face on the reduced diameter portions 20, 22 and 24.

Due to the thinness of the middle plate 46, the portion of the middle plate 46 adjacent to the aperture 68 will readily conform to the juxtaposed surface of the workpiece 36. The thinness and flexibility of the last mentioned portion of the workpiece 36 and the clamping pressure of the wing nuts enables the last mentioned portion to be in pressurized abutting engagement with the juxtaposed surface of the workpiece 36 in a manner so that only a portion of the workpiece 36 which coincides with the aperture 68 will be exposed for a surface finishing operation. The size of the aperture 70 enables a tool such as the end of a blasting gun, a spray gun, etc., to be placed in abutting contact with the exposed portion of the workpiece 36 if desired. Any one of a wide variety of surface finishing operations may be accomplished and will result in a finished portion corresponding to the shape of the aperture 68. Such surface finished portion of the workpiece 36 will be separated from the remainder of the surface of the workpiece 36 by a demarcation line 74 which is sharp and clear. Accurate machining of the aperture 68 enables the surface finished area within the line 74 to be accurately controlled to ±.001 inch.

While the bushings 14, 16 and 18 are a separate element with respect to the base plate 12, it will be appreciated by those skilled in the art that these bushings may be made integral with the base plate 12. The various plates of the sandwich means 42 may be made in various thicknesses and from any one of a wide variety of materials so long as the middle plate is made from a spring type material capable of flexing and conforming to compound curves on the juxtaposed surface of the workpiece as a result of tightening of the wing nuts. While the workpiece 36 has been hatched to indicate that it is made from metal, it will be obvious that the workpiece may be made from other materials including plastics, ceramics, etc. The blind holes in the workpiece 36 for receiving the pins 30–34 are preferably utilized in assembling the completed workpiece if possible. If the workpiece is to be assembled at a later stage in the production of a larger unit, the blind holes may be designed so that they may perform a useful function after the surface finishing operation. In this regard, it will be obvious that the holes in the workpiece 36 for accommodating the pins 30–34 need not be blind holes. That is, some or all of the holes in the workpiece for accommodating the mounting pins may extend through the workpiece. If the holes in the workpiece extend therethrough, the pins 30–34 will have a length which is shorter than the length of said last mentioned holes.

Since the workpieces are always mounted with respect to a fixed orientation means such as the pins 30–34, and since the aperture 68 in the middle plate 46 will always be properly orientated with respect to the workpiece due to the three point registration between the sandwich means 42 and the base plate 12, each workpiece will have the identical surface finished area notwithstanding the fact that various workpieces may vary in size. It will be obvious that the size of the workpiece must always be slightly larger than the size of the aperture 68.

The present invention may be embodied in other specific forms without departing from the spirit or essential attributes thereof and, accordingly, reference should be made to the appended claims, rather than to the foregoing specification as indicating the scope of the invention.

I claim:

1. Apparatus for supporting a workpiece during a surface finishing operation comprising a base, mounting means on one side of said base for supporting a workpiece, a template structure superimposed over said base, means removably securing said structure to said base with only three point registration, said structure having a flexible portion capable of conforming to the contour of a workpiece supported by said mounting means, said portion having an aperture adapted to be in registry with the workpiece, whereby a portion of the workpiece exposed by said aperture may be surface finished.

2. Apparatus in accordance with claim 1 wherein said mounting means on said base includes a plurality of spaced pins adapted to enter a hole in the workpiece, said pins being positioned so as to be in line with said aperture.

3. Apparatus for supporting a workpiece during a surface finishing operation comprising a base, the mounting means on one side of said base for supporting a workpiece, a template structure superimposed over said base, means removably securing said structure to said base with three point registration, said structure having a flexible portion capable of conforming to the contour of a workpiece supported by said mounting means, said portion having an aperture adapted to be in registry with the workpiece, said template structure includes inner and outer plates having a middle plate therebetween, said flexible portion being a part of said middle plate, and means removably securing said plates together so that they are manipulative as a unit, whereby a portion of the workpiece exposed by said aperture may be surface finished.

4. Apparatus in accordance with claim 1 wherein said means removably securing said template structure to said base includes three bolts extending through said template structure, and said bolts being disposed with respect to one another so as to form a triangle.

5. Apparatus in accordance with claim 3 wherein said inner and outer plates are made from a rigid material and are thicker than said middle plate.

6. Apparatus for supporting a workpiece during a finishing operation comprising a flat base, mounting means on the base for supporting a workpiece, a template structure superimposed over said base, three bolt members removably securing said structure to said base, said bolt members being disposed with respect to each other so as to form a triangle, said structure including a discrete plate made from a flexible material, said plate being substantially thinner than the remainder of said structure, said plate having an aperture therethrough adapted to be in registry with a workpiece disposed on said base and supported by said mounting means, whereby a portion of the workpiece exposed by said aperture may be finished.

7. Apparatus in accordance with claim 6 wherein said template structure includes inner and outer plates, said first mentioned plate being disposed between said inner and outer plates, and apertures in said inner and outer plates which are in registry with said first mentioned aperture, the apertures in said inner and outer plates being substantially larger in transverse dimensions than the first mentioned aperture.

8. Apparatus for supporting a workpiece during a surface finishing operation comprising a base, means for mounting a workpiece on said base, a template structure superimposed over said base, means removably securing said structure to said base with three point registration, said structure including a first plate made from a flexible material and having an aperture adapted to be in registry with a portion of the workpiece while it is supported by said mounting means, said workpiece being between said base and said first plate when supported by said mounting means, and a second plate overlying said first plate, said second plate having an aperture in registry with said first plate aperture, the shape of said second plate aperture corresponding generally to the shape of said first plate aperture, the second plate aperture having dimensions greater than the dimensions of said first plate aperture, and means removably securing said first and second plates together.

References Cited by the Examiner

UNITED STATES PATENTS

| | | | |
|---|---|---|---|
| 1,631,041 | 5/27 | Lautenschlager | 269—287 |
| 2,506,047 | 5/50 | Thomas | 118—504 X |
| 2,820,312 | 1/58 | Coontz | 118—505 X |

FOREIGN PATENTS

| | | |
|---|---|---|
| 780,727 | 8/57 | Great Britain. |

ROBERT C. RIORDON, *Primary Examiner.*

BROUGHTON G. DURHAM, *Examiner.*